United States Patent [19]
Mizutani et al.

[11] Patent Number: 5,808,592
[45] Date of Patent: Sep. 15, 1998

[54] INTEGRATED LIGHT-EMITTING DIODE LAMP AND METHOD OF PRODUCING THE SAME

[75] Inventors: Junichi Mizutani, Inazawa; Yuji Takahashi, Gifu-ken; Hideyuki Naganawa, Gifu-ken, all of Japan

[73] Assignee: Toyoda Gosei Co., Ltd., Aichi-Pref, Japan

[21] Appl. No.: 426,940

[22] Filed: Apr. 21, 1995

[30] Foreign Application Priority Data

| Apr. 28, 1994 | [JP] | Japan | ................................. 6-113479 |
| Jul. 15, 1994 | [JP] | Japan | ................................. 6-186398 |
| Oct. 21, 1994 | [JP] | Japan | ................................. 6-257145 |

[51] Int. Cl.$^6$ ........................................................ G09G 3/32
[52] U.S. Cl. .............................. 345/83; 313/512; 362/800
[58] Field of Search ................... 345/82, 83; 340/815.45; 362/800, 812; 348/801, 802; 313/500, 511, 512

[56] References Cited

U.S. PATENT DOCUMENTS

| 4,298,869 | 11/1981 | Okuno ........................................ 345/82 |
| 4,847,531 | 7/1989 | Tsuji et al. ................................. 313/512 |
| 5,036,248 | 7/1991 | McEwan et al. .......................... 362/800 |
| 5,281,830 | 1/1994 | Kotaki et al. .............................. 257/86 |
| 5,390,092 | 2/1995 | Lin ............................................ 362/800 |
| 5,400,229 | 3/1995 | Lin ............................................ 362/800 |

*Primary Examiner*—Jeffery Brier
*Attorney, Agent, or Firm*—Cushman Darby & Cushman IP Group of Pillsbury Madison & Sutro LLP

[57] ABSTRACT

The invention involves an integrated LED lamp (1) whose hood (3) for shielding sun light is detachable and adjustable according to its necessity. Even after the hood is attached to the lamp case, its length is easily altered. A waterproof structure, which is provided by fixing an LED substrate (2) to the case (4) by inserting the hood (3) to the case (4) and printing sealing material (11) at a circumference of the LED substrate (2), edges (32) of the hood, and grades (47) of the case, prevents potting material from leaking into an inner space (44) of the case and reduces manufacturing process for airtight sealing. Further, a through hole (2) on the LED substrate (2) for a pair of leads (13) of an LED (10) is tilted from the horizontal direction by a predetermined degree resulting in an expanding light distribution characteristic to the direction perpendicular to the connecting line k. Also, the direction of light distribution can be controlled by altering the tilt angle of the through holes (20) according to necessity. Further, the integrated lamp (1) has a controlled LEDs arrangement of each color of red, blue, and green in a 5×5 matrix structure assuring homogeneous luminous intensity of each color and white color display with a high quality resulting in improvement in the display quality of a plane display which is made of plural integrated lamps.

11 Claims, 11 Drawing Sheets

R: RED LED
G: GREEN LED
B: BLUE LED

R: RED LED
G: GREEN LED
B: BLUE LED

R: RED LED
G: GREEN LED
B: BLUE LED

Fig. 19

| ARRANGEMENT | NUMBER OF LED | | | STATE OF COLOR MIXING | LUMINOUS INTENSITY [cd] | | | | COST OF LED | NUMBER OF CIRCUIT | | | APPLIED VOLTAGE [V] | | |
|---|---|---|---|---|---|---|---|---|---|---|---|---|---|---|---|
| | R | G | B | | WHITE | RED | GREEN | BLUE | | RED | GREEN | BLUE | RED | GREEN | BLUE |
| No. 1 | 5 | 8 | 12 | × | ◎3.0 | 1.8 | 1.7 | 4.2 | × | 1 | 2 | 6 | 9.0 | 9.2 | 7.6 |
| No. 2 | 5 | 12 | 8 | ◎ | ◎4.4 | 1.8 | 2.5 | 2.8 | ○ | 1 | 3 | 4 | 9.0 | 9.2 | 7.6 |
| No. 10 | 6 | 10 | 9 | ○ | ◎3.7 | 2.1 | 2.1 | 3.2 | ○ | 1 | 2 | 3 | 10.8 | 11.5 | 11.4 |
| No. 16 | | | | △ | | | | | | | | | | | |

INTEGRATED LIGHT-EMITTING DIODE LAMP AND METHOD OF PRODUCING THE SAME

BACKGROUND OF THE INVENTION

1. Field of the invention

The present invention relates to an integrated light emitting diode (LED) lamp which is made of several blue, red, and green LEDs controlling its emission colors and a method of manufacturing the integrated LED lamp. Several integrated lamps are further integrated into a large display panel whose one dot is an integrated lamp. Further, the present invention relates to the large display panel made of several integrated lamps, which is arranged to be disposed outside.

2. Description of the Prior Art

Since a chip of a LED has difficulties emitting three colors at the present level of technology, plural chips which respectively emit one of the three primary colors, (red, green, and blue), have been integrated into one chip and utilized as an integrated ROB lamp (hereinafter integrated lamp). Such a lamp enables the emission of colors in a wide range.

Manufacturing a blue LED with a high luminous intensity had been technologically difficult. Accordingly, the conventional integrated lamp had problems in controlling its emission colors. Although the recent technological development of a gallium nitride (GaN) LED improves the luminous intensity of blue color and the controllability of the color of the integrated lamp as a whole, an effective LED arrangement in a matrix structure is still not presented considering the different luminous intensities among the plural chips which respectively emit one of the three primary colors.

The integrated lamp is further integrated into a large display panel disposed mainly outside. When the display panel is disposed where sun light impedes visibility of the display panel, a hood for shielding sun light, similar to a hood of a traffic signal, is required as a precaution. Conventionally, such a hood is a part of a case of the integrated lamp and is not separable or adjustable from the case. Such structure of the integrated lamp raises several problems.

The hood designed to enhance visibility occasionally contributes to the contrary. The display panel is not always disposed outside where sun light influences visibility. When it is disposed inside and outside where sun light does not influence visibility, the hood itself becomes useless. However, the conventional hood is a part of the case and is not separable from the case. Consequently, the hood rather impedes visibility.

Further, the length of the hood is needed to be altered depending on an angle of incident sun light. Since the conventional hood itself is not adjustable, a case with hood of intended length has to be prepared according to where the display lamp is disposed prior to its disposition. Once it is disposed and found to be improper in hood length, the whole case has to be replaced, and thus, requires a lot of work.

Waterproofing the integrated lamp is another structural problem. Leads of LEDs in an integrated lamp are embedded in waterproof resin. When the resin is potted into the case, it leaks into the inside of the case through a clearance between a LED substrate and the case. Such a leak degrades the waterproofing of each integrated lamp, and the surface of the resin becomes bumpy. Consequently, the quality of each integrated lamp as a whole is degraded. A conventional precaution against leakage is shown in FIG. 11. O rings 45, or packings, lie between the LED substrate 2 and the case 4. A LED substrate 2 is screwed by a screw bolt 46 which projects into the case 4. This airtight seal structure utilizing packings or O rings 45 needs to form squarely shaped packings or O rings depending on the shape of the case. This requires extra cost and a lot of work for their attachment.

Soldering LEDs to the LED substrate is another problem. Leads of each LED are put through through-holes of the LED substrate and are soldered at the back of the substrate. Since the posture of the LEDs is unstable till the solder is solidified, the LEDs slightly tilt, and thus, so do their light axes. The through holes of the LED substrate are formed regularly in the horizontal and vertical directions so that many of the LEDs polarize their light axes along with the through-holes. Consequently, the visual angle of the integrated lamp is biased.

SUMMARY OF THE INVENTION

It is an object of the present invention to provide a detachable hood from a case of an integrated lamp so as to expand its application.

It is another object of the present invention to alter the length of the hood easily so as to utilize the lamp at any place.

It is the third object of the present invention to improve the waterproofing of the integrated lamp.

It is the fourth object of the present invention to unify the visual angle of the integrated lamp.

It is the fifth object of the present invention to simplify the assembly of the integrated lamp ensuring waterproofing.

It is the sixth object of the present invention to provide effective LED arrangements in a matrix structure considering different luminous intensities of the LEDs which respectively emit one of the three primary colors.

The first aspect of the invention is providing an integrated lamp which has a structure to fix a LED substrate by inserting the hood into the case and to embed leads of the LEDs by a potting material.

The second aspect of the invention is tilting the direction of the two leads of a LED to the horizontal direction.

The third aspect of the invention is printing an elastic material on the circumference of the LED substrate where the lamp case contacts.

The fourth aspect of the invention is an elastic material with enough thickness to be formed by screen printing in a manufacturing process of the LED substrate.

The fifth aspect of the invention is a manufacturing process of the integrated lamp constituted by the steps of forming LED substrates, printing elastic material where a LED substrate and a lamp case contact, arranging LEDs on the LED substrate, and assembling the LED substrate into the lamp case.

The sixth aspect of the invention is a potting process to embed leads of the LEDs on the LED substrate into waterproof material in addition to the manufacturing process described in the fifth aspect.

The seventh aspect of the invention is arrangement of LEDs of three primary colors in a 5×5 matrix structure considering visual characteristics.

Since the hood has several patterns and is easily attached to the case, the number of applications of the integrated lamp increases. Further, since the length of the hood is easily adjustable, the relation between the visibility and the shielding effect is well balanced according to where the lamp is placed.

Further, since inserting the hood to the case fixes the LED substrate to the case, the assembly of the integrated lamp is simplified.

Further, the sealing material printed at circumference of the LED substrate prevents potting material from leaking into the inner space of the case. Further, the sealing material which is elastic in nature, mitigates the stress against the LED substrate generated by pushing the substrate by the hood at the time of assembly.

Further, the tilting arrangement for aligning the direction of the through-holes of the LED substrate provides a uniform visual angle.

Further, a controlled LED arrangement of each color in a 5×5 matrix structure provides a white color display. A display module made of such integrated lamps prevents some parts of words from overlapping each other when they are displayed scrolling on the module.

BRIEF DESCRIPTION OF THE DRAWING

In the accompanying drawings:

FIG. 19 is a table exhibiting data of the integrated lamps in Examples 1, 5 to 7.

DETAILED DESCRIPTION OF THE PREFERRED EMBODIMENT

The invention will be more fully understood by reference to the following examples.

EXAMPLE 1

Figure 1A:
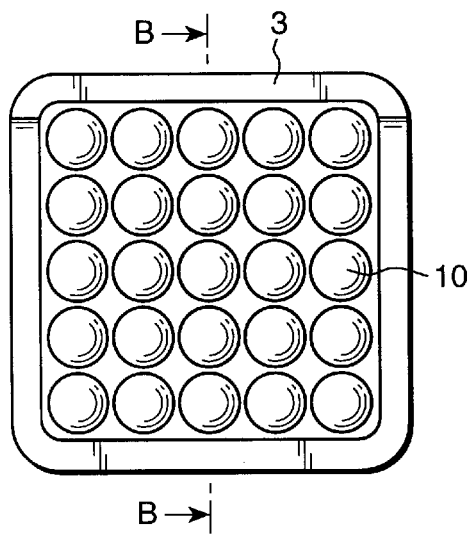
FIG. 1A is a front view of the integrated lamp embodied in Example 1.
Figure 1B:
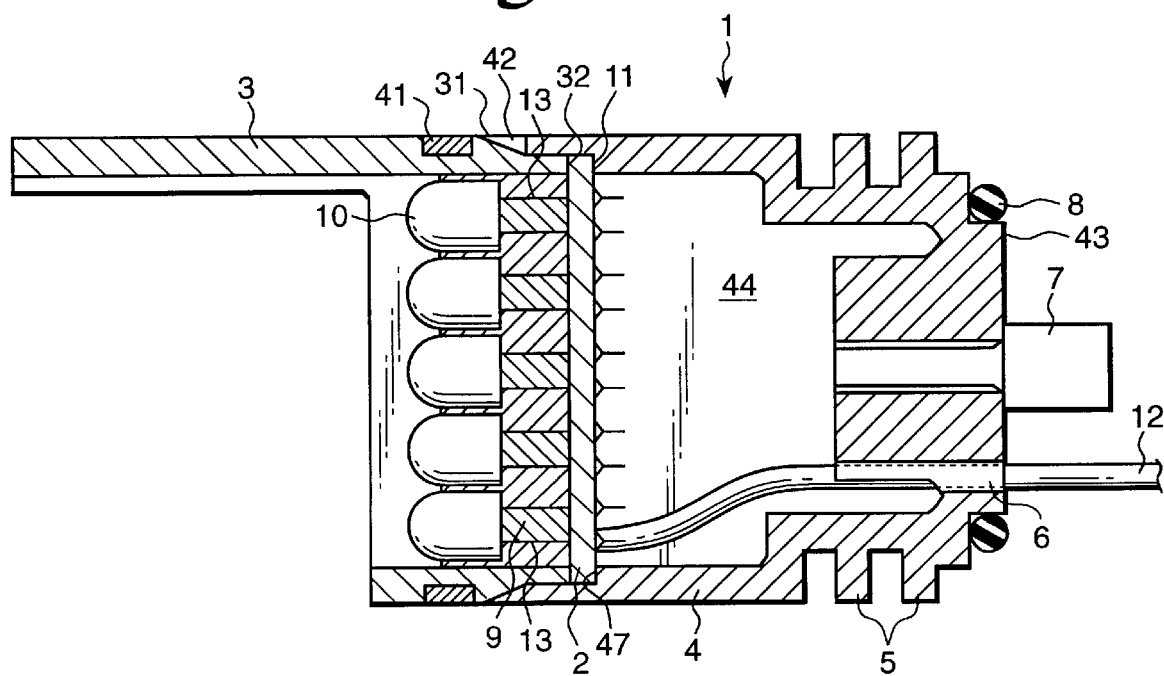
FIG. 1B is a vertical section of the integrated lamp embodied in Example 1.

The structure of an integrated lamp related to this embodiment is explained here. FIG. 1A shows a front view of the integrated lamp 1 and FIG. 1B shows a cross-sectional view taken on line B—B of FIG. 1A.

The integrated lamp 1 is mainly made of a case 4, a hood 3, and several LEDs 10 formed on a LED substrate 2. A part of the lamp hood 3 has a click 31 which is inserted into the case 4. A joint 41 of the case 4 has a hook hole 42. The hood 3 is inserted and fixed to the case 4 by the click 31 fit into the hook hole 42.

Twenty five LEDs 10 are arranged in a 5×5 matrix structure on the LED substrate 2. By pressing the ends 32 of the hood 3 against graded parts 47, the LED substrate 2 is fixed to the case 4.

A lamp fixture 7 is attached at the center of the rear 43 of the case 4 so as to fix the integrated lamp 1 to a display panel, temporarily. Inserting the fixture 7 of each integrated lamp into each hole formed on the display panel which is not shown in any figures forms a flat display panel. Packings 8 are placed where the rear 43 and the display panel contact. Further, some outer parts of the case 4 have a concave shape to function as radiating fins 5 so as to release generated heat by the LEDs 10.

A wire 12 connects the LED substrate 2 with outer control circuits which are not shown in any figures through a hole 6 so as to control flash of the LEDs 10.

Figure 2A:
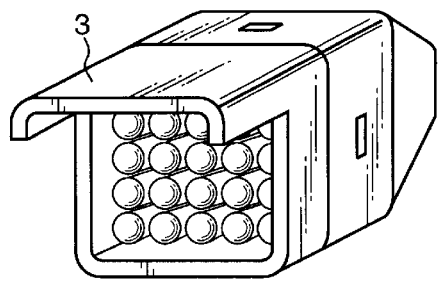
FIGS. 2A to 2C are variations of the hoods in Example 1.
Figure 2B:
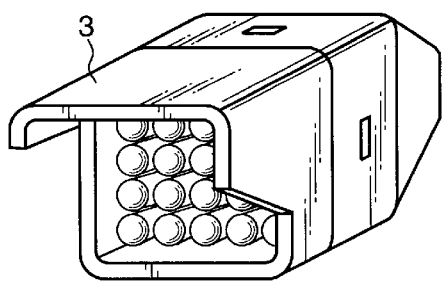
Figure 2C:
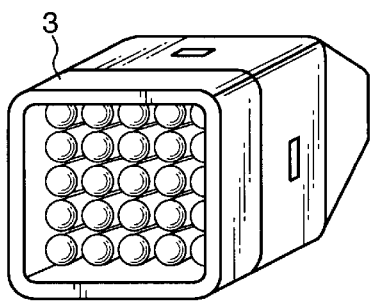

The lamp hood 3 is detachable from the case 4 as described above. Therefore, a hood can be selected among several variations according to necessity. When the integrated lamp 2 is placed where it is constantly exposed to outer light from right side, the hood 3 shown in FIG. 2B is effective as a shield. A combination of the hoods shown in FIGS. 2A to 2C is also effective for placing the hood 3 of FIG. 2A at the top line of the display lamp, the hood 3 of FIG. 2B at the most right, the hood 3 of FIG. 2C at center. Further, the inner surface of the hood 3 may be processed by a surface treatment such as an embossment so as to prevent the reflection of the LEDs 10 on themselves. Further, a hood with a shorter brim may be attached to the integrated lamp inside of a building, where sun light does not reach, so as to expand visibility. Consequently, the detachable hood 3 widens its application.

Figure 5A:
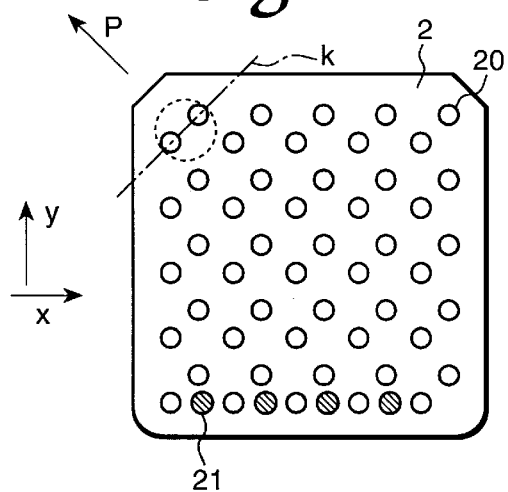
FIG. 5A is a top view of arrangement of through-holes formed on the LED substrate in Example 1.
Figure 5B:
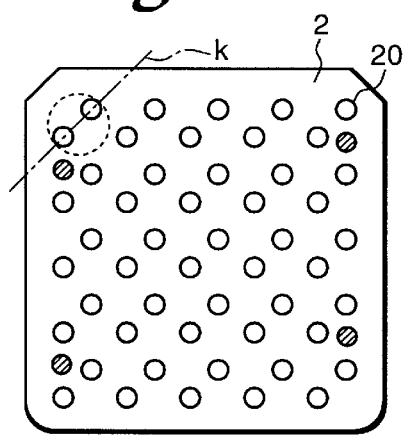
FIG. 5B is the back of the LED substrate shown in FIG. 5A in Example

Assembling the LED substrate 2 to the case 4 is explained here. FIG. 5A exhibits the surface of the LED substrate 2 where the LEDs 10 are arranged. FIG. 5B exhibits the back of the LED substrate 2 where leads 13 of the LEDs 10 are soldered. Many through-holes 20 are formed through the LED substrate 2 as shown in FIGS. 5A and 5B. The LEDs 10 are arranged keeping a constant height by soldering their leads 13 at the back of the substrate 2 through the through-holes 20.

As shown in FIG. 1B, space between the bottom of the LEDs 10 and the LED substrate 2 is filled with potting material 9 and the leads 13 are embedded thereto. This potting material 9 perfectly waterproofs inner space 44 of the case 4.

Figure 6A:
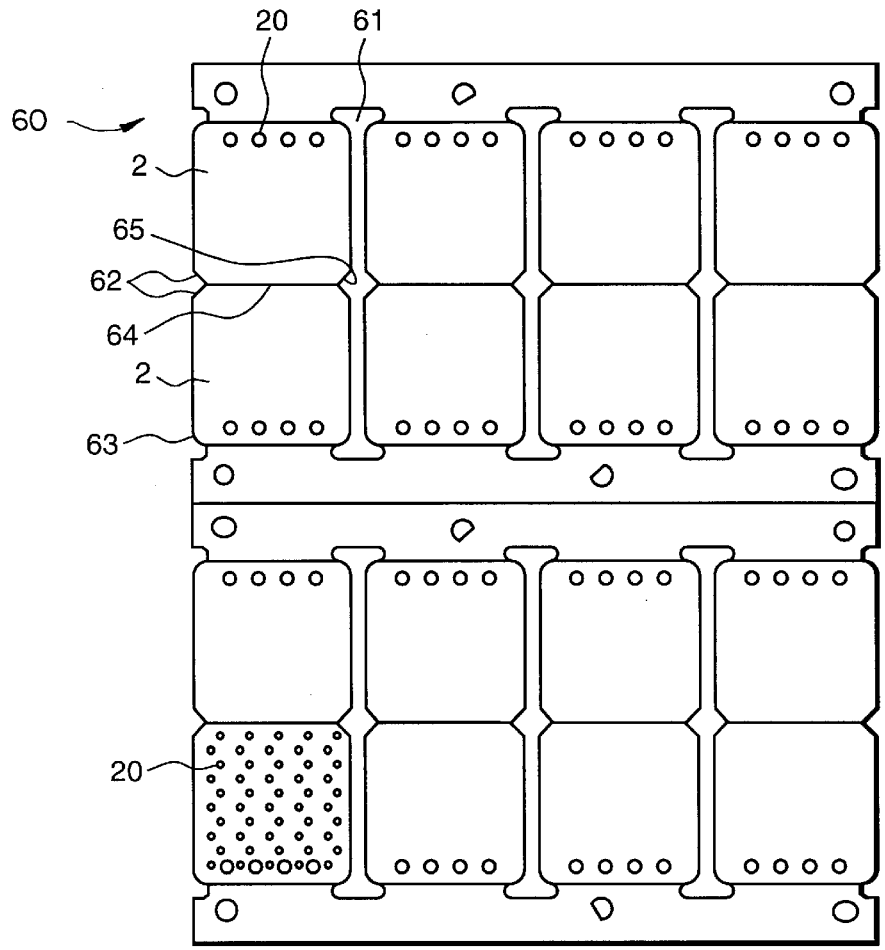
FIG. 6A is a top view exhibiting a plane substrate on which several LED substrates are formed in Example 1.
Figure 6B:
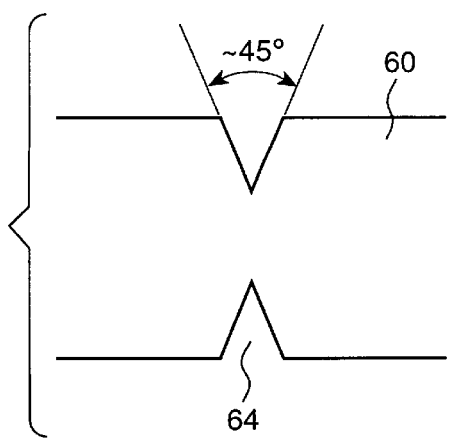
FIG. 6B is a fragmentary cross-sectional view of a LED substrate.
Figure 6C:
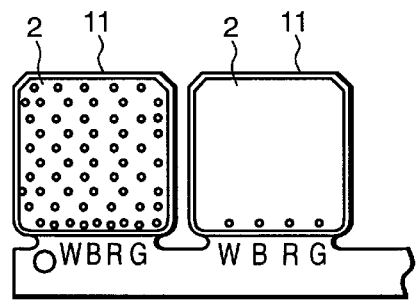
FIG. 6C is a top view exhibiting arrangement relation between the LED substrate and sealing material.

Further, sealing material 11 is printed by screen printing on the circumference of the LED substrate 2 as shown in FIG. 6C. This sealing material 9 is advantageous in the following two points. Leakage of potting material 9 into the inner space 44 of the case 4 is prevented, because the sealing material 11 tightly contacts the grades 47 of the case 4. Further, since the sealing material 11 is elastic, internal stress against the LED substrate 2 is mitigated which is generated by being pushed by the ends 32 of the hood 3 against the grades 47 of the case 4 when the hood 3 is inserted into the case 4 is mitigated.

Several projections of 0.5 mm may be formed at the edges 32 of the hood 3 which contact with the LED substrate 2 so as to press the LED substrate 2 against the grades 47 of the case 4. Even when manufacturing errors weaken the pressure of the hood 3 against the grades 47, the sealing material 11 prevents space between the LED substrate 2 and the grades 47 of the case 4 from emerging, and the potting material 9 from leaking into the inner space 44.

Soldering the LEDs 10 to the LED substrate 2 is explained here.

A print substrate such as glass epoxy such as CEM 3 is utilized as the LED substrate 2. As described earlier, the LEDs 10 are arranged on the LED substrate 2 by soldering the leads 13 of the LEDs 10 at the back of the LED substrate 2 through the through-holes 20. This soldering process is carried out by dipping the back of the LED substrate 2 into molten solder while the leads 13 of all the LEDs 10 are standing through the through-holes 20.

Since the LEDs 10 are not completely fixed to the LED substrate 2 until the molten solder is dried up, slight machine vibration tilts light axes of the LEDs 10 in an orthogonal plane against an arrangement in the direction k which connects a pair of the through-holes 20 for a LED placement. In other words, the light axes of the LEDs 10 respectively tilt to the vertical direction y or the horizontal directions when the through-holes 20 are arranged in either of the horizontal direction x and the vertical direction y. Since the distribution of tilt angles of the light axes of the LEDs 10 becomes a normal distribution, the visual angle of the integrated lamp 1 becomes either longer in the vertical direction y and shorter in the horizontal direction x or shorter in the vertical direction y and longer in the horizontal direction x.

Figure 5C:
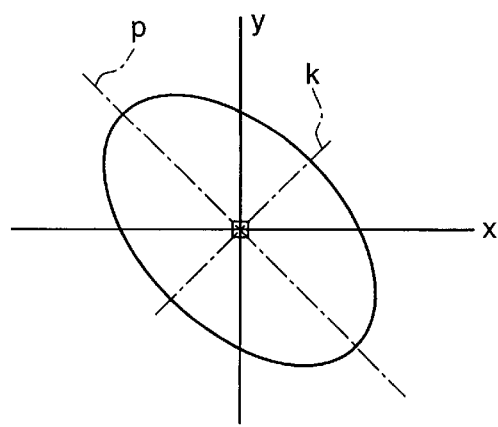
FIG. 5C is a view explaining light distribution of the integrated lamp using the LED substrate of FIG. 5A in Example 1.

In this embodiment, the arrangement of direction connecting a pair of the through-holes 20 is tilted from the horizontal direction x toward the direction y by 45 degrees so as to expand the visual angle of the integrated lamp 1 both in the horizontal and vertical directions x and y. Accordingly, the light axes of the LEDs 10 are tilted to the vertical direction p against the direction k, and the distribution of the tilt angles of the LEDs 10 to the direction p becomes a normal distribution. Consequently, the visual angle of the integrated lamp 1 becomes an ellipse with the major axis p as shown in FIG. 5C. Namely, the visual angle of the integrated lamp 1 becomes equal in the horizontal direction x and in the vertical direction y, and altering the arrangement of the direction k of a pair of the through-holes 20 enables the control of the visual angle of the integrated lamp 1.

Figure 4:
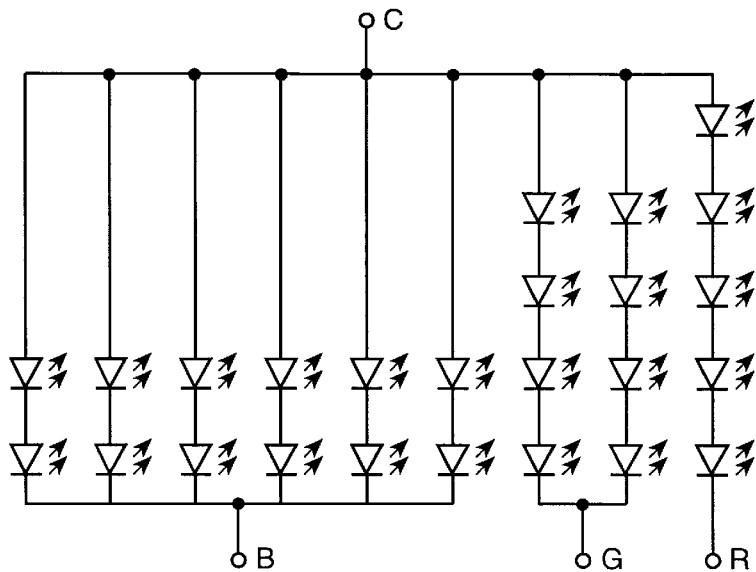
FIG. 4 is a circuit diagram of the integrated lamp in Example 1.

The leads 13 of the LEDs 10 of each color are connected in series through the through-holes 20 and finally connected to terminal lands 21 of each color. This wiring pattern is shown in FIG. 4. Terminal lands oC, oR, on, and oB in FIG. 4 correspond to the terminal lands 21 in FIG. 5A, respectively.

Since the LEDs 10 are shell shaped with a 3 mm diameter and the space between leads 13 per LED 10 becomes 2.5 mm, the space for wiring pattern having a conventional arrangement is narrow. In this embodiment, however, the arrangement of the direction of the through-holes 20 is tilted by 45 degrees from the horizontal direction x so that wiring becomes easier with wider space.

Figure 7A:
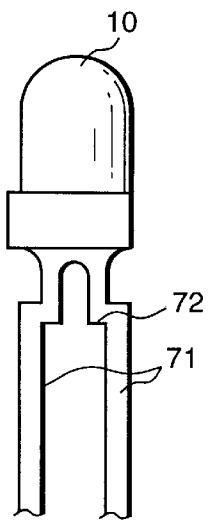
FIGS. 7A to 7C are outer views exhibiting leads structure of the LEDs in Example 1.
Figure 7B:
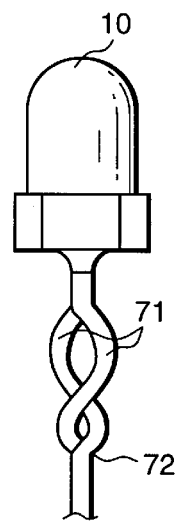
Figure 7C:
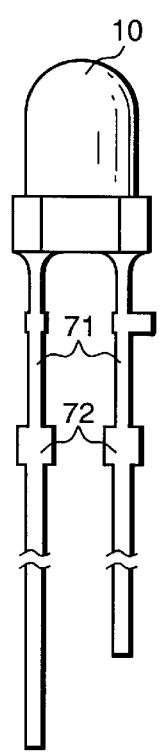

The leads 13 of the LEDs 10 have stoppers 72 as shown in FIG. 7A so as to keep a constant height of all LEDs 10 from the LED substrate 2. Since the stoppers 72 block the through-holes 20 at the surface side of the LED substrate 2, all of the LEDs 10 are enabled to keep a constant height. Alternatively, various stoppers 72 such as those shown in FIGS. 7B and 7C can be formed on the leads 13.

Figure 3A:
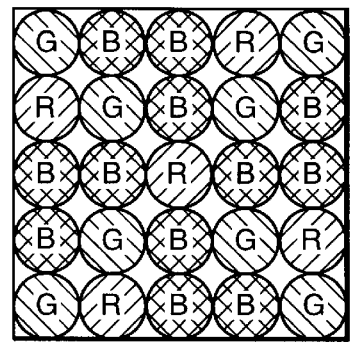
FIGS. 3A to 3C are matrix structures of LEDs of the integrated lamps in Example 1.
Figure 3B:
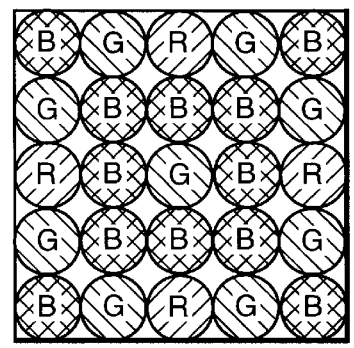
Figure 3C:
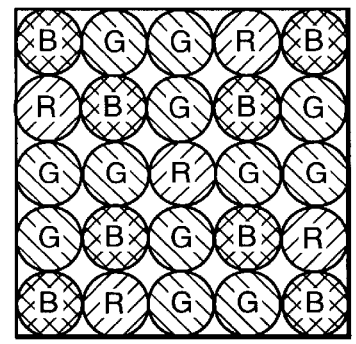

The arrangement of the LEDs 10 on the LED substrate 2 explained here with reference to FIGS. 3A to 3C.

The integrated lamp 1 has 25 LEDs 10 in a 5×5 matrix structure. The number of LEDs of each color is predetermined. A white color display is realized by flashing all of the LEDs 10 at a time. The quality of the white color depends on the luminous intensity of each color which the LEDs 10 emit. Since the 5×5 matrix structure of the LEDs 10 constitutes one dot of color display, the luminous intensity of each color display differs from each other if the three color LEDs are equally distributed in number. Namely, the arrangement pattern and distribution number of the three color LEDs 10 influence visibility. Especially when the luminous intensity of the blue LEDs is small, their various arrangements on the LED substrate 2 alter the minimum distance to exhibit the white color.

In this embodiment, arrangements of each color of the LEDs 10 as shown in FIGS. 3A to 3C enable white color to be recognized at minimum distance. The LED arrangement of FIG. 3A uses five red LEDs R, eight green LEDs G, and twelve blue LEDs B. The LED arrangement of FIG. 3B uses four red LEDs R, nine green LEDs G, and twelve blue LEDs B. A larger number of blue LEDs than that of the other two color LEDs are distributed per LED substrate 2 so as to compensate for lower luminous intensity of the blue LED and to increase the bluer components among the LEDs 10. Consequently, color controllability of the integrated lamp 1 is improved. When blue LEDs with high luminous intensity are utilized, the number of the green LEDs G is increased and the number of the blue LEDs B is decreased as shown in FIG. 3C.

Referring to FIG. 4, the structure of an inner circuit of the integrated lamp 1 is explained here. The inner circuit has relatively many blue LEDs so as to compensate for their lower luminous intensity compared with those of the other colors of LEDs. Namely, the inner circuit has a series circuit made of five red LEDs, two series circuits respectively made of four green LEDs G and arranged in parallel, and six series circuits respectively made of two blue LEDs B and arranged in parallel. Since driving currents of the blue LEDs are not equal, luminous intensity of the blue LEDs is not homogeneous. Current regular diodes (CRD) may be utilized so as to solve the problem. Namely, the CRDs may be connected to the respective series circuits of the blue LEDs at least in series. Further, a driving circuit of the display panel is simplified since each of the integrated lamps 1 controls current by its own inner circuit.

A manufacturing process of the integrated lamp 1 is explained hereinafter.

As shown in FIG. 6A, each chip of the LED substrate 2 is obtained by dividing a plane substrate 60. Sixteen LED substrates 2 can be manufactured at a time. The plane substrate 60 has stamping parts 61 and cutting parts 64 partitioning each LED substrate, and later divided at those parts 61 and 64 so as to obtain a chip of the LED substrate 2. Since the stamping parts 61 are easily processed, each corner 63 of the LED substrates 2 are cut to form arc. The two corners 63 which are next to each other across the cutting part 64 are called corner parts 65 and chamfered by 90 degrees. The cutting part 64 is formed in V shape by 45 degrees as shown in FIG. 6B of a partial vertical section of FIG. 6A. The through-holes 20 are formed as shown in FIGS. 5A and 5B.

Then, the sealing material 11 is printed by screen printing on the circumference of each of the LED substrates 2. The screen may be, for example, a stainless screen of 80 mesh. Normally, one screen printing provides enough thickness to connect the LED substrate 2 with the grades 47 closely. Two or more screen printings may be carried out if needed.

Then, the sealing material 11 printed on the plane substrate 60 is hardened by irradiating ultraviolet ray. Alternatively, materials which are hardened by moisture can be used. In this case, the plane substrate 60 is kept in atmosphere for a required time instead of an irradiation of ultraviolet ray.

Then, the leads 13 of the LEDs 10 are inserted through all the through-holes 20 according to predetermined color arrangement. The leads 13 are soldered after the back of the substrate 2 is dipped into the molten solder. Each wire in the group of wires 12 shown in FIG. 1B is soldered at terminal lands 21 on the surface of the LED substrate 2 through the through holes 20 for the terminal lands 21 from the back of the LED substrate 2. Then, the plane substrate 60 is divided into each chip of the LED substrate 2 by removing the stamping parts 61 and bending at the cutting parts 64. Since the terminal lands for the group of wires 12 are formed on the surface of the LED substrate 2 where the LEDs 10 are arranged, the through-holes 20 for the terminal lands 21 remain open even after the back of the LED substrate 2 is dipped into the molten solder.

Then, the divided LED substrate 2 is set at the grades 47 of the case 4 as shown in FIG. 1B. The hood 3 is inserted into the case 4 so as to fix the LED substrate 2, tightly. The potting material 9 is poured by a dispenser and turning upward the front of the integrated lamp 1 to thereby obtain the integrated lamp 1 as shown in FIG. 1B.

The plane substrate 60 may be stamped out soon after the sealing material 11 is printed thereon. The sealing material 11 may be printed on the surface side of the LED substrate 2 where the LEDs 10 are arranged thereon in the same way as shown in FIG. 6C. In this case, the inner space 44 of the case 4 is shielded by the LED substrate 2 pushed by the ends 32 of the hood 3.

EXAMPLE 2

Figure 8A:
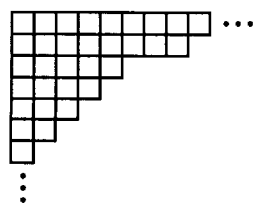
FIGS. 8A to 8C are variational arrangements of the integrated lamps in Example 2.
Figure 8B:
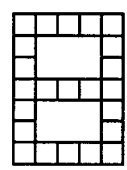
Figure 8C:
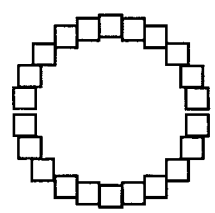

FIGS. 8A to 8C exhibit various arrangements of the plural integrated lamps into a display panel. FIG. 8A shows a large full color plane display arranged in matrix structure. FIG. 8B exhibits a large segment display device. Further, the integrated lamp 1 can be arranged in flexible manner to form any patterns such as a circle as shown in FIG. 8C.

EXAMPLE 3

Figure 9A:
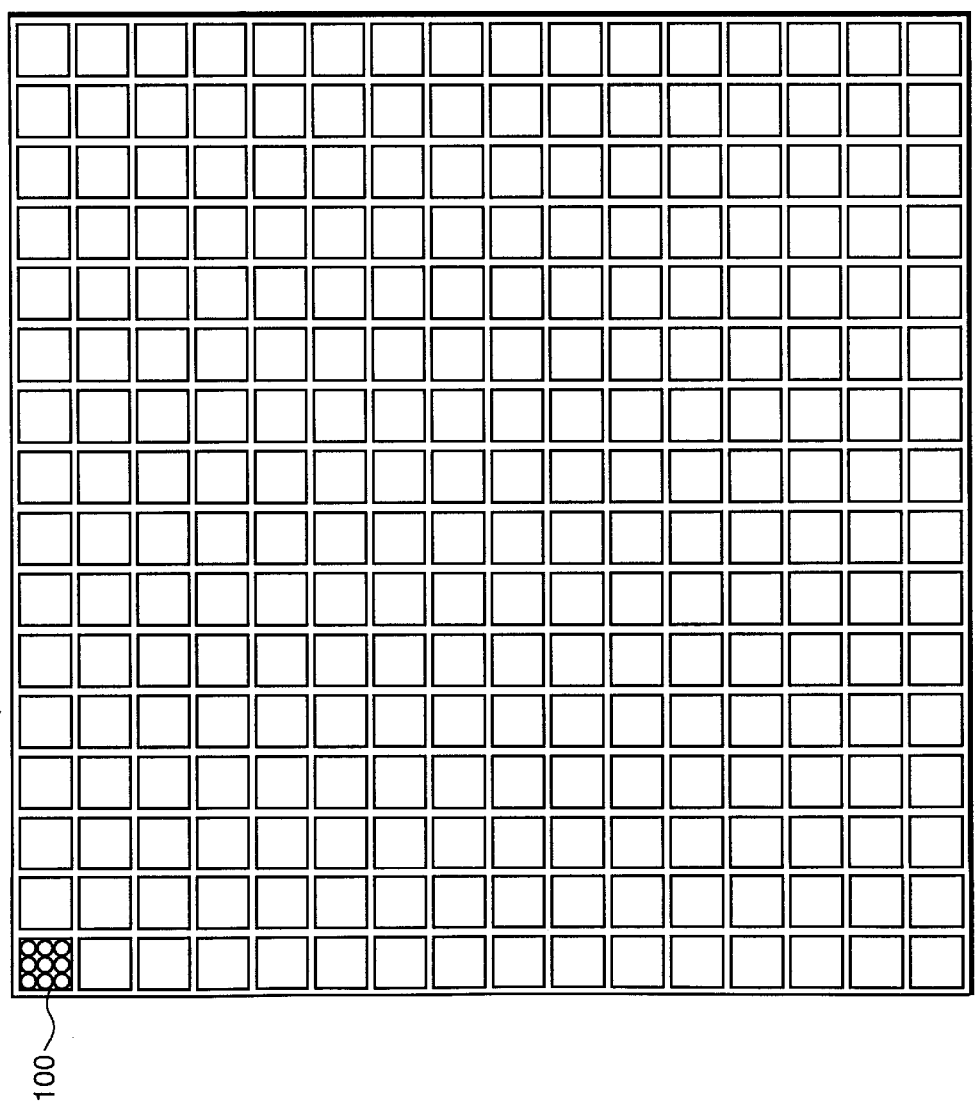
FIG. 9A is a top view exhibiting integrated lamp module arranged in matrix in Example 3.

FIG. 9A exhibits a flat display module 90 arranging several units 100 in a matrix structure on a LED substrate, or module substrate 91. Each unit 100 has a matrix structure of 3×3 LEDs. Alternatively, the unit 100 may have n×n LEDs such as 5×5 LEDs. The module 90 has a matrix structure of 16×16 units 100 and its display unit of one dot corresponds to one unit 100. Namely, the module 90 enables to display one letter constituted by 16×16 dot matrix structure.

Figure 9B:
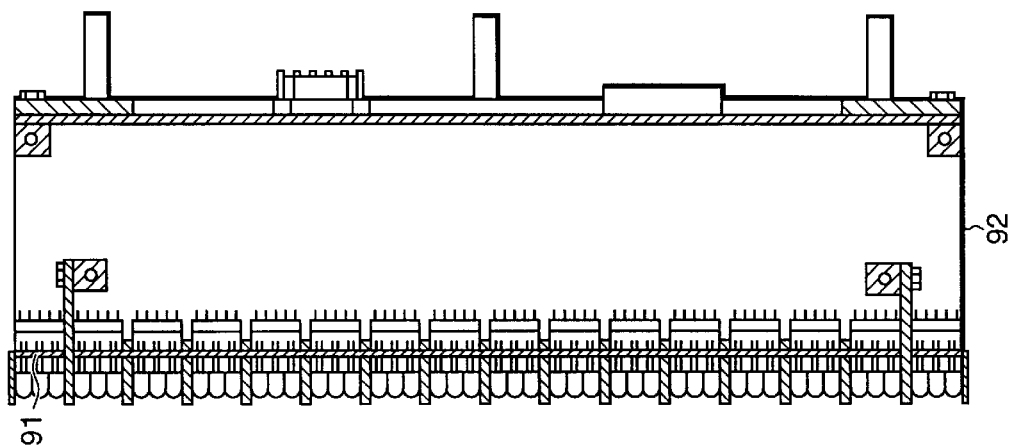
FIG. 9B is a sectional view of FIG. 9A.

This display module 90 which has a large common LED substrate 91 for several units 100 is different from the display module shown in FIG. 8A which has a substrate and a case for each of the integrated lamps 1. Namely, the module 90 is made of the module substrate 91 on which all LEDs are arranged and a case 92 as shown in FIG. 9B.

Figure 10:
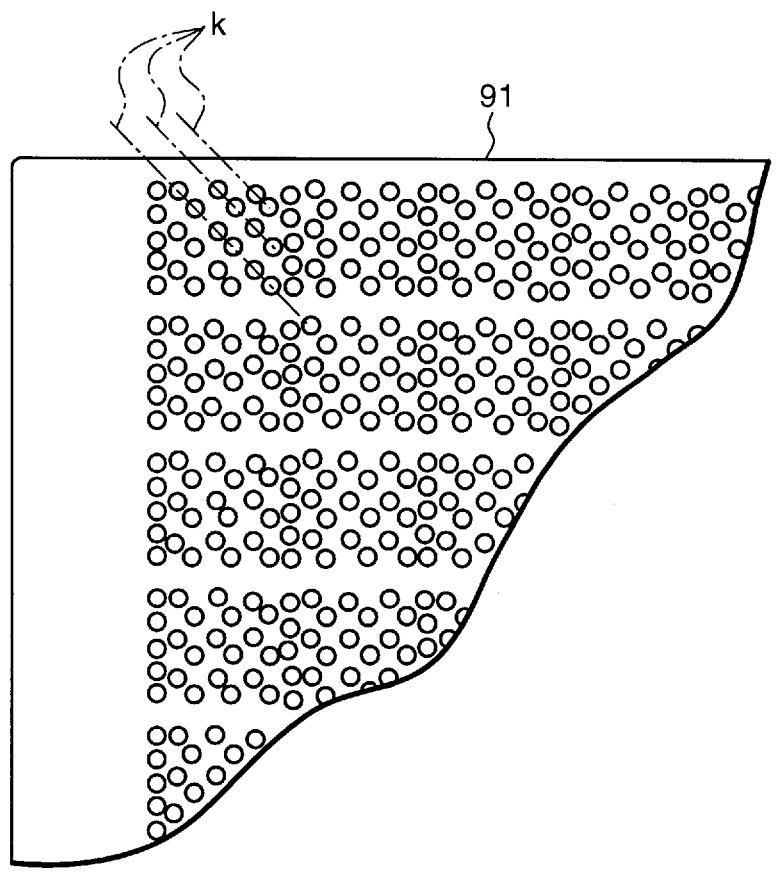
FIG. 10 is a fragmentary top view exhibiting the LED substrate utilized for a module in Example 3.
Figure 11:
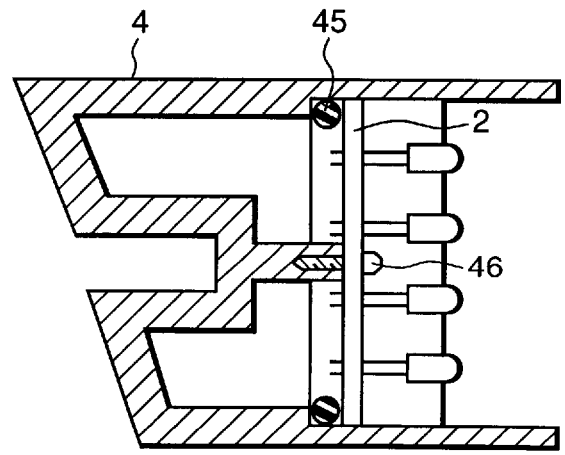
FIG. 11 is a sectional view exhibiting structure of a conventions integrated lamp.

As shown in FIG. 10, the arrangement of the direction of the pairs of the through-holes 20 to insert the leads 13 of the LEDs is tilted by 45 degrees horizontally in the direction k.

The description of "arrangement of the direction of a pair of leads" indicates the direction of a line of intersection between a plane formed by two parallel leads of a shell shaped LED and the plane of the substrate, or the direction of extended line k between a pair of through holes as shown in FIGS. 5A and 5B. The description of "vertical or horizontal direction of the substrate" indicates the direction of either vertical side y or horizontal side x of the LED substrate 2 shown in FIGS. 5A and 5B, or the direction of the x or y axis shown in FIG. 5C.

EXAMPLE 4

Figure 12:
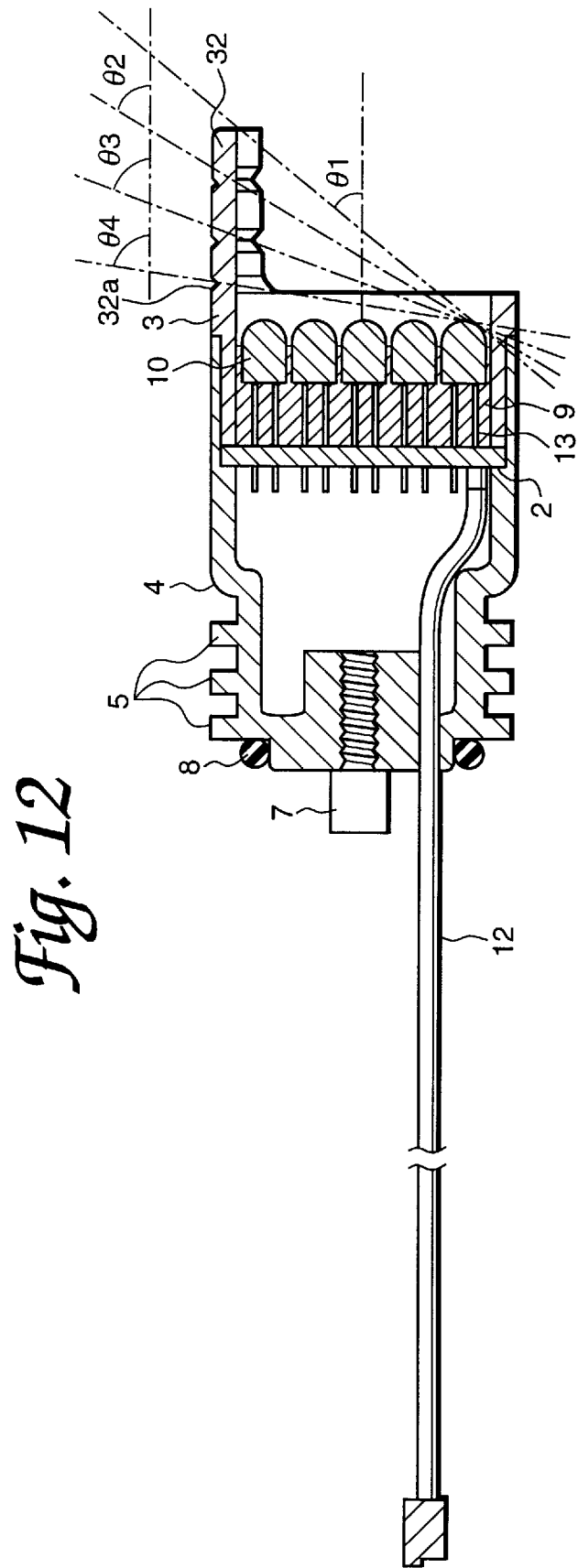
FIG. 12 is a vertical section of the integrated lamp in Example 4.
Figure 13:
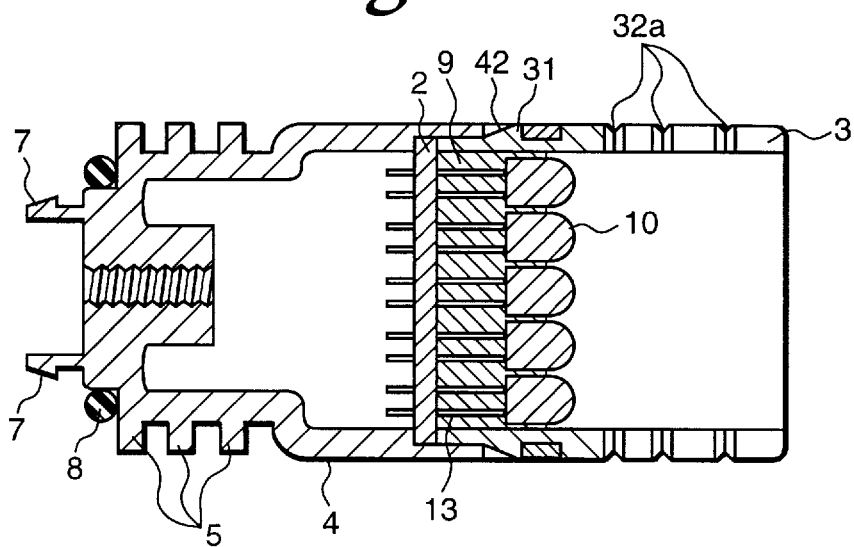
FIG. 13 is a transverse sectional view of the integrated lamp in Example 4.

Referring to FIGS. 12 and 13, another variation of the hood 3 is explained here as Example 4.

The salient part of the hood 3 functions as a shielding part 32 to shield sun light. It juts out from the tips of LEDs 10 when the hood 3 is inserted into a case 4. The shielding part 32 has several cutting caves 32a on and across its outer side. In this example, the number of the cutting caves 32a are three. They are formed at predetermined intervals so as to equalize sun light protective angles θ1, θ2, θ3, and θ4. Namely, the hood 3 in this embodiment can be varied in its length from one to four steps by cutting off the salient part 32 at each of the cutting caves 32a.

Figure 14:
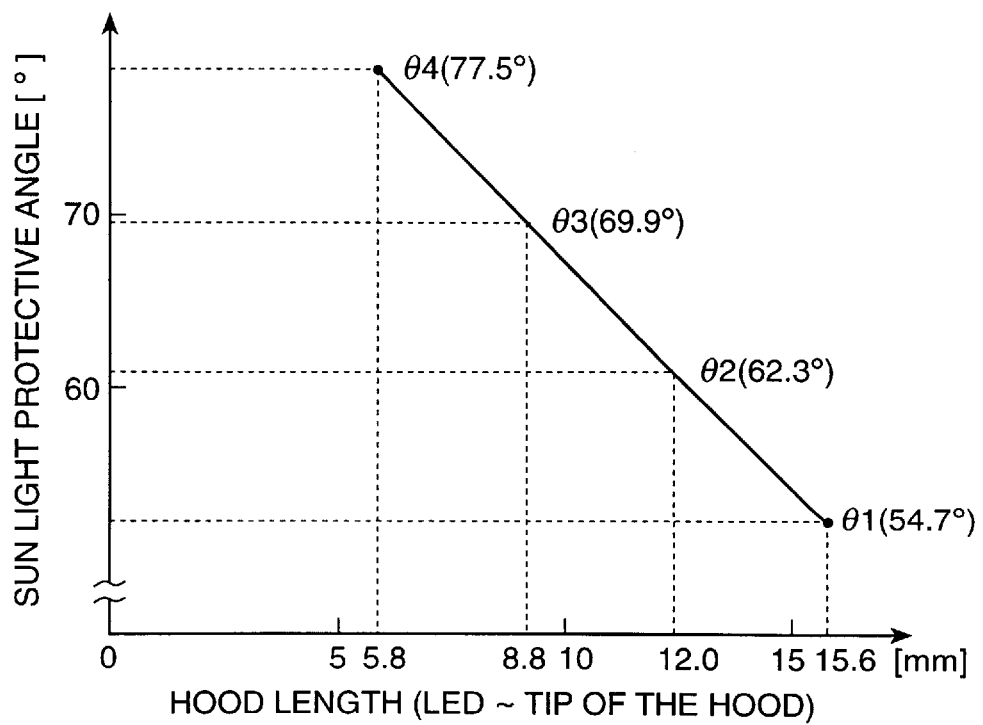
FIG. 14 is a characteristic view exhibiting the relation between the hood length of the integrated lamp and protective angle against direct sun light.

In concrete, the length of the salient part 32 from the base to the tip is 15.6 mm before being cut, 12.0 mm after being cut at the first cutting cave 32a from the tip of the salient part 32, 8.8 mm after being cut at the second cutting cave 32a, and 5.8 mm after being cut at the third cave 32a which is the closest to the base. FIG. 14 shows the relation between the length of the salient part 32 and protective angles θ1, θ2, θ3, and θ4. The protective angle θ1 becomes 54.7 degree without cutting the salient part 32. The protective angles θ2, θ3, and θ4 become 62.3, 69.9, and 77.5 degree when the salient part 32 is cut at the first, second, and third cutting caves 32a, respectively. This structure helps control sun light protective angle by 7.6 degree with ease even after the hood 3 is inserted into the case 4.

EXAMPLE 5

Figure 15:
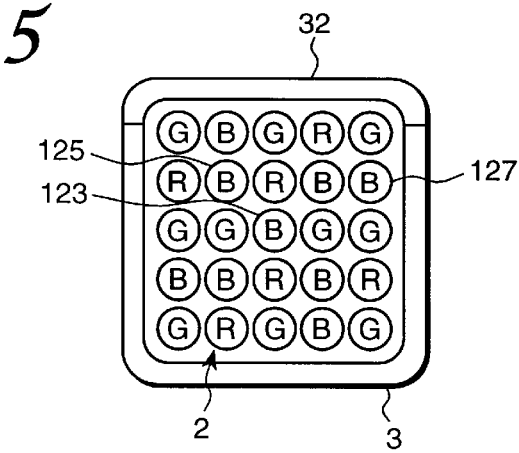
FIG. 15 is a top view of matrix structure of the integrated lamp in Example 5.
Figure 16:
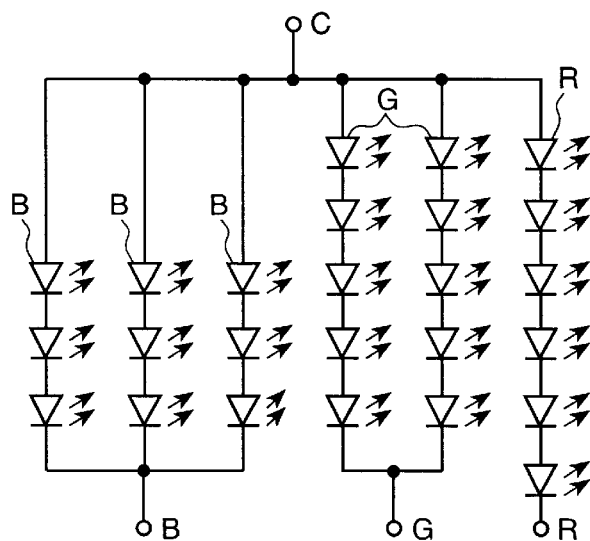
FIG. 16 is a circuit diagram of the integrated lamp in Example 6.

This embodiment relates to LEDs arranged in a matrix structure with reference to FIGS. 15 and 16.

FIG. 15 shows a LED matrix constituting a first luminous part 123, a second luminous part 125, and a third luminous part 127. The first luminous part 123 is a blue LED B which is centered on the integrated lamp. The second luminous part 125 is made of 8 LEDs surrounding the first luminous part 123 in a square. Four blue LEDs B are placed at each corner of the part 125, and respective two green LEDs G and two red LEDs R are placed between the blue LEDs B in symmetrical arrangement with the first luminous part 123 as a point of symmetry. The third luminous part 127 is made of 16 LEDs surrounding the second luminous part 125 in a square. Four green LEDs G are placed at each corner of the part 125, and each side of the square has a blue LED B, a green LED G, and a red LED R in continuous and clockwise arrangement. Namely, the LED matrix in this embodiment utilizes six red LEDs R, ten green LEDs G, and nine blue LEDs B.

Referring to FIG. 16, an inner circuit of the integrated lamp is explained. The inner circuit has a series circuit made of six red LEDs, two parallel circuits respectively made of five green LEDs G, and three parallel circuits respectively made of three blue LEDs B. The anode common C side of the inner circuit is connected to the cathode of the LED circuits of each color ROB by a wire 12. Further, the wire 12 connects the LED circuits of each color to driving circuits which are not shown in FIG. 16 to control each of the LEDs R, G, and B. These driving circuits control each circuit to flash targeted colors with targeted luminous intensity as selected by a duty control.

The applied voltage to red LEDs is defined as Vr, to green LEDs as Vg, and to blue LEDs as Vb. The Vr, Vg, and Vb to each LED circuits satisfy the relation $Vr \leq Vb \leq Vg$. In particular, as shown in No. 10. of FIG. 19, Vr is 10. 8V, Vg is 11.5 V, and Vb is 11.4 V since the forward voltage to a red LED is 1.8 V, to a green LED is 2.3 V, and to a blue LED is 3.8 V.

In this embodiment, the number of each color of the LEDs is differentiated in relation to its luminous intensity. Six red LEDs R, which are the smallest number of all, are arranged on the LED substrate, because of its ability to emit high luminous intensity. The number of the arranged green LEDs G is ten and is the largest number of all, because of its low luminous intensity. The number of the arranged blue LEDs is nine. The blue LEDs have a luminous intensity which has been improved by recent technological development. Accordingly, the combination of these numbers of the LEDs enables the integrated lamp to flash each color with a uniform luminous intensity as a whole and exhibit a white color with a high luminous intensity by mixing the three colors.

Further, in this embodiment, each color of the LEDs is arranged considering the visual characteristics of human beings. Arranging each LED continuously without extra space enables color to be shown at a uniform size. Further, the planned arrangement of the LEDs avoids biased distribution of each color and helps flash each color distinctively so as to prevent scrolling words or characters displayed on the lamp from being overlapped with each other. Further, green LEDs G, whose color draws the least attention among the three colors, are placed at each comer of the integrated lamp so as to mitigate the inevitable concentration of the green color around comers when several integrated lamps are integrated in matrix structure on a display panel. Consequently, visibility from outside of the integrated lamp 2 becomes better.

Further, the loads on the driving circuit are mitigated by reducing the number of parallel circuits. In this embodiment, the inner circuit has six LED circuits which are comparatively fewer in number. Since electric consumption increases in direct proportion to a square current, or a square number of parallel circuits, fewer parallel circuits are desirable. Consequently, the driving circuits require a smaller driving current, thus mitigating loads on themselves such as current concentration.

Further, since the values of the applied voltage Vr, Vg, and Vb are close to each other, there is no need to prepare for separate driving circuits or a power source for the LED circuits of each color. Each voltage drop for each LED circuit in the driving circuit can become small by the same reason.

The required current is the largest for the green LED and the smallest for the red LED. Accordingly, power loss in the driving circuit can be minimized by adjusting the voltage of the power source to the applied voltage of the green LED circuit.

EXAMPLE 6

Figure 17:
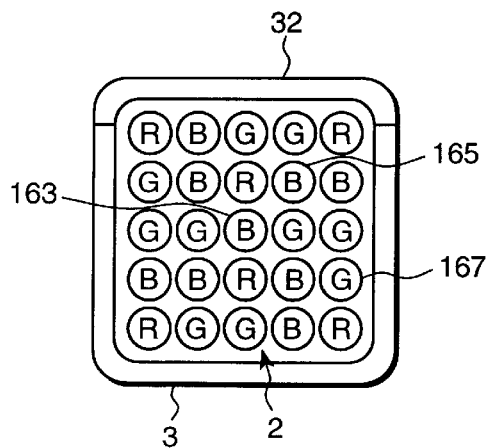
FIG. 17 is a top view of matrix structure of the integrated lamp in Example 6.

Referring to FIGS. 17 and 19, another example of LED arrangement in a matrix structure is explained. The first luminous part 163 and the second luminous part 165 have LEDs arranged in the same manner as those corresponding parts in Example 5. The third luminous part 167 has a different arrangement of LEDs from the corresponding part in Example 5. Four red LEDs R are placed at each corner of the third luminous part 167, and a blue LED B and two green LEDs G are placed at each side in a continuous and clockwise arrangement. Each of the total number of the LEDs R, G, B is the same as those in Example 5. The applied voltages to each circuit and its constitution are the same as those employed in Example 5. Consequently, the effects obtained by this Example 6 become the same as those obtained in Example 5 as shown in No. 16 of FIG. 19.

EXAMPLE 7

Figure 18:
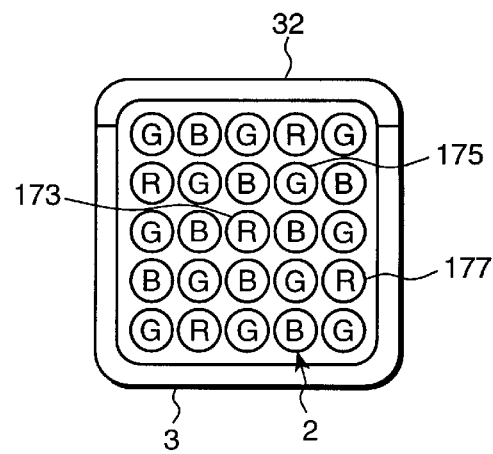
FIG. 18 is a top view of matrix structure of the integrated lamp in Example 7.

Referring to FIGS. 18 and 19, another example of LED arrangement in a matrix structure is explained here. The first luminous part 173 is a red LED R which is centered on the integrated lamp 2. The second luminous part 175 is made of 8 LEDs surrounding the first luminous part 173 in a square. Four green LEDs G are placed at each comer of the part 175, and a blue LED B is placed between the green LEDs G at each side. The third luminous part 177 is made of 16 LEDs surrounding the second luminous part 175 in a square. Four green LEDs G are placed at each comer of the part 177, and each side of the square has a blue LED B, a green LED G and a red LED R in a continuous and clockwise arrangement. Namely, the LED matrix in this embodiment utilizes five red LEDs R, twelve green LEDs G, and eight blue LEDs B.

An inner circuit of the integrated lamp 2, not shown in any figures, has a series circuit made of five red LEDs, three series circuits arranged in parallel respectively made of four green LEDs G and two series circuits arranged in parallel respectively made of four blue LEDs B. Accordingly, respective applied voltages Vr, Vg, and Vb to each of the LED circuits are 9.0 V, 9.2 V, and 7.6 V as shown in No. 2 of FIG. 19, since the forward voltage is 1.8 V per red LED, 2.3 V per a green LED, and 3.8 V per a blue LED.

The combination of these numbers of the LEDs enables the integrated lamp 1 to flash each color uniformly and exhibit white color with a high luminous intensity by mixing the three colors.

Further, the red LEDs of the third luminous part 177 are arranged symmetrically regarding the first luminous part 173 as a point of symmetry. Arranging each color of LED continuously without extra space at second and third light emitting parts 175 and 177 enables the same effect to be obtained as that described in Example 5.

Characteristics of the integrated lamps 1 in Examples 5 to 7 are compared with that of the integrated lamp 1 embodied in Example 1 which is shown in FIG. 3A. FIG. 19 is a table comparing data of each of the integrated lamps 1 in aspects of mixing ratio of the three colors at a flashing white color, luminous intensity, cost, number of series circuit arranged in parallel, and applied voltage. He following conditions are set as a premise of this comparison. The mixing ratio of each color for white color flashing satisfies the relation, R:G:B= 1:4:2. The luminous intensity of a 5 mm$\phi$ LED diameter is 500 mod per red LED, 300 mod per green LED, and 500 mod per blue LED. Luminous intensity of 3 mm$\phi$ LED diameter is 350 mod per red LED, 210 mod per green LED, and 350 mod per blue LED. Forward voltages per red, green, and blue LEDs are 1.8 V, 2.3 V, and 3.8 V, respectively.

As a result, the arrangement No. 2 embodied in Example 7 exhibit the best characteristics of all in the aspects of mixing ratio, luminous intensity, and cost. In contrast, the arrangement of No. 10 and 16 in Examples 5 and 6 exhibit the best characteristic in the aspects of the number of series circuits and the condition for applied voltage, or the mitigation of loads in the driving circuit. As compared with the arrangement No. 2 and with the arrangements Nos. 10 and 16, the value of the difference of the applied voltage is larger in spite of the small value difference regarding mixing ratio and luminous intensity. Namely, the integrated LED lamp in Example 7 costs less excluding the cost of the driving circuit, but it cost more including the cost of the driving circuit. As a whole, the total cost of the integrated lamp embodied in Examples 5 and 6 seem to be cheaper than that of the integrated lamp in Example 7. Therefore, the integrated lamps in Examples 5 and 6 are the most desirable of all.

While the invention has been described in connection with what are presently considered to be the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. An integrated light-emitting diode lamp as one display unit comprising:

a substrate;

at least three light-emitting diodes respectively emitting red, green, and blue color light arranged on said substrate, leads of said diodes being embedded in to a waterproof material;

a hood with an end;

a case with an edge surface in a step shape on an open side of said case; and wherein said substrate is fixed between said end and said edge surface by inserting said hood into said case.

2. An integrated light-emitting diode lamp comprising:

a lamp substrate;

a plurality of light-emitting diodes arranged on a front surface of said substrate, leads of said diodes being embedded into a potting material;

a lamp case with an edge surface in step shape on an open side of said case; and wherein an elastic material for sealing is disposed at the circumference of a back side of said lamp substrate and sandwiched between said lamp substrate and said edge surface for preventing leakage of said potting material into an inner space between said lamp substrate and said lamp case.

3. An integrated light-emitting diode lamp of claim 2, wherein said elastic material has a thickness to be piled by screen printing at the time of manufacturing said lamp substrate.

4. An integrated light-emitting diode lamp with a matrix structure of 5×5 light-emitting diodes, said matrix structure comprising:

a first luminous part made of a blue light-emitting diode placed at center of said matrix structure;

a second luminous part made of eight light-emitting diodes surrounding said first luminous part squarely with four blue light-emitting diodes placed at each corner and respective two red and green light-emitting diodes placed between said blue light-emitting diodes in symmetrical regarding said first luminous part as a point of symmetry; and a third luminous part made of sixteen light-emitting diodes surrounding said second luminous part squarely with four green light-emitting diodes placed at each corner and a blue, a green, and a red light-emitting diodes placed at each side clockwise in this order.

5. An integrated light-emitting diode lamp with a matrix structure of 5×5 light-emitting diodes, said matrix structure comprising:

a first luminous part made of a blue light-emitting diode placed at center of said matrix structure;

a second luminous part made of eight light-emitting diodes surrounding said first luminous part squarely with four blue light-emitting diodes placed at each corner and respective two red and green light-emitting diodes placed between said blue light-emitting diodes in symmetrical regarding said first luminous part as a point of symmetry; and a third luminous part made of sixteen light-emitting diodes surrounding said second luminous part squarely with four red light-emitting diodes placed at each corner and a blue and two green light-emitting diodes placed at each side clockwise in this order.

6. An integrated light-emitting diode lamp with matrix structure of 5×5 light-emitting diodes, said matrix structure comprising:

a first luminous part made of a red light-emitting diode placed at center of said matrix structure;

a second luminous part made of eight light-emitting diodes surrounding said first luminous part squarely with four green light-emitting diodes placed at each corner and a blue light-emitting diodes placed between said green light-emitting diodes at each side; and a third luminous part made of sixteen light-emitting diodes surrounding said second luminous part squarely with four green light-emitting diodes placed at each corner and a blue, a green, and a red light-emitting diodes placed at each side clockwise in this order.

7. An integrated light-emitting diode lamp of claim 4 further comprising:

a series circuit of six red light-emitting diodes two series circuits of five green light-emitting diodes arranged in parallel; and three series circuits of three blue light-emitting diodes arranged in parallel.

8. An integrated light-emitting diode lamp of claim 5 further comprising:

a series circuit of six red light-emitting diodes two series circuits of respective five green light-emitting diodes arranged in parallel; and three series circuits of respective three blue light-emitting diodes arranged in parallel.

9. An integrated light-emitting diode lamp of claim 7, wherein applied voltages to each of said series circuit of respective color light-emitting diodes are controlled to satisfy applied voltage Vr to said series circuit of red light-emitting diodes, Vg to said series circuit of green light-emitting diodes, and Vb to said series circuit of blue light-emitting diodes with the formula Vg≧Vb≧Vr.

10. An integrated light-emitting diode lamp comprising:

a substrate;

a plurality of light-emitting diodes arranged in matrix structure on said substrate;

a case surrounding outer surface of said substrate;

a hood jutting out from tips of said light-emitting diodes by a projection roof; and wherein cutting caves are formed on an outer surface of said projection roof in a direction parallel to said substrate for altering the length of said projection roof by breaking said projection roof at each of said cutting caves.

11. An integrated light-emitting diode lamp of claim 10, wherein said cutting caves are formed at uneven intervals so as to alter sun light protective angles from θ1 to θn (n>1) in steps at an uniform degree.

* * * * *